US009177649B2

United States Patent
Gu

(10) Patent No.: US 9,177,649 B2
(45) Date of Patent: Nov. 3, 2015

(54) FLASH MEMORY CIRCUIT

(71) Applicant: Grace Semiconductor Manufacturing Corporation, Shanghai (CN)

(72) Inventor: Jing Gu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/017,770

(22) Filed: Sep. 4, 2013

(65) Prior Publication Data

US 2014/0140132 A1  May 22, 2014

(30) Foreign Application Priority Data

Nov. 20, 2012  (CN) .......................... 2012 1 0473174

(51) Int. Cl.
    *G11C 16/08*  (2006.01)
    *G11C 16/04*  (2006.01)
(52) U.S. Cl.
    CPC ............ *G11C 16/08* (2013.01); *G11C 16/0441* (2013.01)
(58) Field of Classification Search
    USPC .............. 365/185.18, 230.06, 230.05, 185.13
    See application file for complete search history.

(56) References Cited

U.S. PATENT DOCUMENTS

| | | | | |
|---|---|---|---|---|
| 6,366,500 | B1 * | 4/2002 | Ogura et al. | 365/185.29 |
| 6,714,456 | B1 * | 3/2004 | Ogura et al. | 365/185.28 |
| 6,868,012 | B2 * | 3/2005 | Natori | 365/185.18 |
| 6,925,005 | B2 * | 8/2005 | Kawamura et al. | 365/185.12 |
| 6,934,191 | B2 * | 8/2005 | Maemura | 365/185.23 |
| 7,139,193 | B2 * | 11/2006 | Kanai | 365/185.05 |
| 7,450,434 | B2 * | 11/2008 | Tanuma et al. | 365/185.29 |
| 7,495,958 | B2 * | 2/2009 | Chih | 365/185.13 |
| 7,608,882 | B2 * | 10/2009 | Lung et al. | 257/315 |
| 7,701,767 | B2 * | 4/2010 | Chu et al. | 365/185.14 |

* cited by examiner

*Primary Examiner* — Hoai V Ho
*Assistant Examiner* — Minh Dinh
(74) *Attorney, Agent, or Firm* — Harness, Dickey & Pierce, P.L.C.

(57) ABSTRACT

A memory circuit is provided, including: a plurality of sectors, where each sector includes at least two parallel rows of memory units; a first control line, a second control line and a word line corresponding to each row of memory units, where at least two of the first control lines which are in the same sector and neighboring with each other are connected, and at least two of the second control lines which are in the same sector and neighboring with each other are connected; and a plurality of bit lines perpendicular with the word lines. The number of the first and second control lines may be reduced, so decoding units which control the control lines may occupy less chip areas, thereby reducing chip areas occupied by the memory circuit.

11 Claims, 2 Drawing Sheets

FLASH MEMORY CIRCUIT

CROSS REFERENCE TO RELATED APPLICATIONS

The present application claims priority to Chinese Patent Application No. 201210473174.0, filed on Nov. 20, 2012 and entitled "FLASH MEMORY CIRCUIT", the entire disclosure of which is incorporated herein by reference.

FIELD OF THE DISCLOSURE

The present disclosure generally relates to semiconductor technology, and more particularly, to a flash memory circuit with shared control lines.

BACKGROUND OF THE DISCLOSURE

Flash memory, attributing to its convenience, high memory density and ideal reliability, has been a research hotspot in non-violate storage devices. Currently, development of flash memory is promoted by motivation of chasing higher memory density. However, due to structure limitation, memory densities of conventional flash memories may no longer be increased by simply shrinking the device dimensions.

Generally, flash memory devices can be classified into two types: gate-split flash memories and stacked flash memories. Compared with stacked flash memories, gate-split flash memories, due to their specific structures, may have better performance in programming and erasing. For example, gate-split flash memories may have higher programming efficiency, and word line structures thereof can prevent "over erase". Therefore, gate-split flash memories are used broadly. However, compared with stacked flash memories, gate-split flash memories have one additional word line, which may increase the chip area. To increase memory density, normally there is a need to improve structures of gate-split flash memories.

Some existing flash memory units may have two silicon nitride layers functioning as float gates in each bit unit. Therefore, in each flash memory unit, there may be stored 4 bits of data, which may greatly increase the memory density. However, manufacturing processes of these flash memory units may be complicated.

BRIEF SUMMARY OF THE INVENTION

A memory circuit is provided, in which control lines are shared. The chip area occupied by the memory circuit may be reduced without changing the structures of memory units. Therefore, the memory density of memory devices may be increased.

According to an embodiment of the present disclosure, a memory circuit is provided, including: a plurality of sectors, where each sector includes at least two parallel rows of memory units, each memory unit includes a first bit unit and a second bit unit; a first control line, a second control line and a word line corresponding to each row of memory units, where the first control line controls the first bit units, the second control line controls the second bit units, the word line is parallel with the first and second control lines, where at least two of the first control lines which are in the same sector and neighboring with each other are connected, and at least two of the second control lines which are in the same sector and neighboring with each other are connected; and a plurality of bit lines perpendicular with the word lines.

Optionally, the memory circuit further includes a plurality of sector decoding units corresponding to the sectors respectively, wherein each sector decoding unit includes a first control line decoding unit, a second control line decoding unit and a word line decoding unit, the word line decoding unit is used to controlling voltages on each word line in the sector, the first control line decoding unit is used to control voltages on the first control lines in the sector, and the second control line decoding unit is used to control voltages on the second control lines in the sector.

Optionally, when all the first control lines in the same sector are connected and all the second control lines in the same sector are connected, the first control line decoding unit is used to control voltages on all the first control lines in the same sector, and the second control line decoding unit is used to control voltages on all the second control lines in the same sector.

Optionally, when a programming process or a reading process is performed to one of the memory units, voltages on the first control lines in the sector corresponding to the memory unit are the same, voltages on the second control lines in the sector are the same, and a voltage on the word line corresponding to the memory unit to be programmed or read is different from voltages on other word lines.

Optionally, a first part of the first control lines in the sector are connected, a second part of the first control lines in the sector are connected, a first part of the second control lines in the sector are connected, and a second part of the second control lines in the sector are connected, the first control line decoding unit is used to control voltages on the first and second parts of the first control lines, and the second control line decoding unit is used to control voltages on the first and second parts of the second control lines.

Optionally, when a programming process or a reading process is performed to one of the memory units, voltages on the same part of the first control lines are the same, which are different from voltages on the other part of the first control lines in the sector and voltages on the first control lines in other sectors, voltages on the same part of the second control lines are the same, which are different from voltages on the other part of the second control lines in the sector and voltages on the second control lines in other sectors, and a voltage on the word line corresponding to the memory unit to be programmed or read is different from voltages on other word lines.

Optionally, the memory unit includes: a semiconductor substrate, a gate on the semiconductor substrate, a first bit unit and a second bit unit on two sides of the gate, a tunneling oxidation layer between the semiconductor substrate and the first bit unit, and between the semiconductor substrate and the second bit unit, a source in the semiconductor substrate which is on a side of the first bit unit far away from the gate, a drain in the semiconductor substrate which is on a side of the second bit unit far away from the gate, wherein the first bit unit includes a first float gate, a first control gate and a first spacer encompassing the first float gate and the first control gate, and the second bit unit includes a second float gate, a second control gate and a second spacer encompassing the second float gate and the second control gate.

Optionally, the first control gate is coupled with the first control line, the second control gate is coupled with the second control line, the gate is coupled with the word line, the source is coupled with the bit line on one side of the memory unit, and the drain is coupled with the bit line on another side of the memory unit.

Optionally, when a programming process or a reading process is performed to one of the memory units, the memory unit to be programmed or read is selected by controlling voltages on the bit lines and the word line corresponding to the memory unit, where voltages on the bit lines on two sides of the memory unit to be programmed or read are different.

Optionally, when a programming process or a reading process is performed to one of the memory units, the memory unit to be programmed or read is selected by controlling voltages n the bit lines and the word line corresponding to the memory unit, and voltages on the bit lines on each side of the memory unit are regularly decreased to 0V.

Optionally, there are at least two rows of memory units in one of the sectors.

Embodiments may have following advantages compared with conventional memory circuits.

Since there are at least two neighboring first control lines connected and at least two neighboring second control lines connected in one sector, the number of the first control lines need to be controlled by a corresponding first control line decoding unit may be reduced, and the number of the second control lines need to be controlled by a corresponding second control line decoding unit may be reduced, at the condition that the memory unit still can be properly erased, programmed and read. In some embodiments, the first control line decoding unit corresponding to the sector may only need to control one control line, so as the second control line decoding unit. The first and second control line decoding units may have simplified circuit structures and thus occupy much less chip areas. Therefore, the memory circuit may occupy less chip area. Furthermore, embodiments are compatible with existing techniques because there is no need to change structures of the memory units and manufacturing process thereof. Therefore, manufacturing costs may be saved.

Furthermore, when all the first control lines in the same sector are connected and all the second control lines in the same sector are connected, the first control line decoding unit may only need to control the voltage on one control line, so does the second control line decoding unit. The circuit structure of the first and second control line decoding units may be greatly simplified, and the chip areas occupied by them may be tremendously reduced, thereby reducing the chip area occupied by the memory circuit.

DETAILED DESCRIPTION OF THE INVENTION

In conventional techniques, memory densities of flash memory devices are normally increased by changing structures of flash memory unit therein, which may increase processing complexity and manufacturing costs. A memory circuit is provided according to embodiments of the present disclosure. The memory may include a plurality of sectors. Each sector may include at least two parallel rows of memory units, and each memory unit may include a first bit unit and a second bit unit. Each row of memory units may correspond to a first control line controlling the first bit units, a second control line controlling the second bit units, and a word line in parallel with the first and second control lines. A plurality of bit lines are distributed in the memory circuit, which are perpendicular with the word lines. In one sector, at least two neighboring first control lines are connected, and at least two neighboring second control lines are connected.

Since there are at least two neighboring first control lines connected and at least two neighboring second control lines connected in one sector, the number of the first control lines need to be controlled by a corresponding first control line decoding unit may be reduced, and the number of the second control lines need to be controlled by a corresponding second control line decoding unit may be reduced, at the condition that the memory unit still can be properly erased, programmed and read. In some embodiments, the first control line decoding unit corresponding to the sector may only need to control one control line, so as the second control line decoding unit. The first and second control line decoding units may have simplified circuit structures and thus occupy much less chip areas. Therefore, the memory circuit may occupy less chip area. Furthermore, embodiments are compatible with existing techniques because there is no need to change structures of the memory units and manufacturing process thereof. Therefore, manufacturing costs may be saved.

In order to clarify the objects, characteristics and advantages of the disclosure, embodiments of the disclosure will be interpreted in detail in combination with accompanied drawings.

Although the present invention is disclosed hereinafter with reference to preferred embodiments in detail, it also can be implemented in other different embodiments and those skilled in the art may modify and vary the embodiments without departing from the spirit and scope of the present invention. Therefore, the present invention should not be limited by the embodiments disclosed herein.

Figure 1:
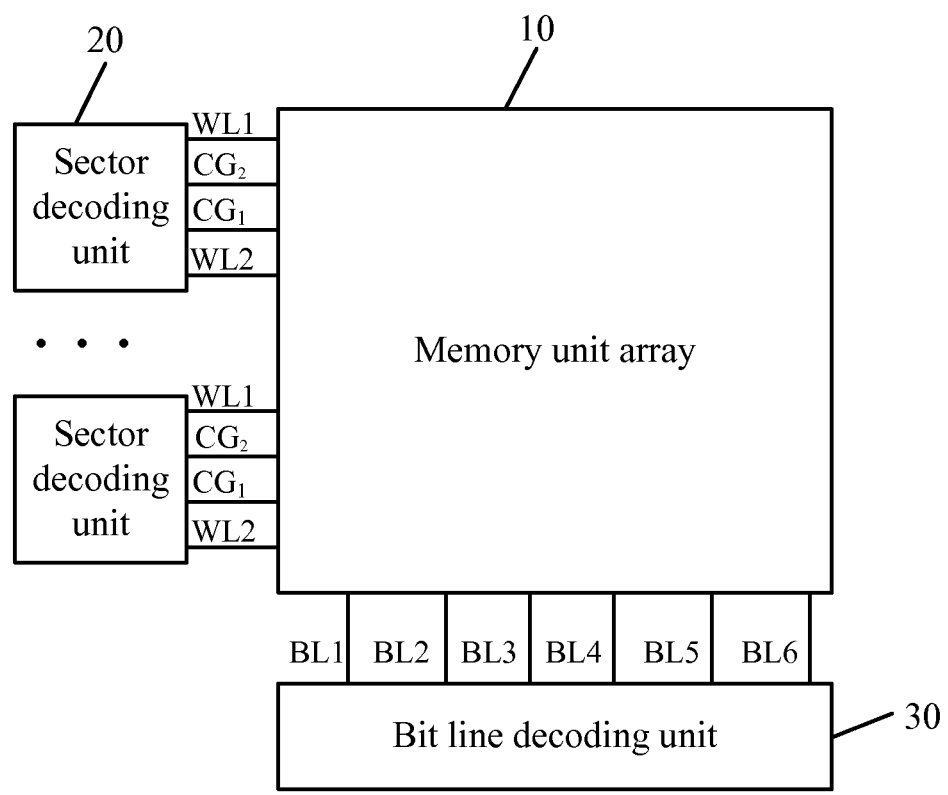
FIG. 1 schematically illustrates a structural diagram of a memory circuit according to one embodiment of the present disclosure.
Figure 2:
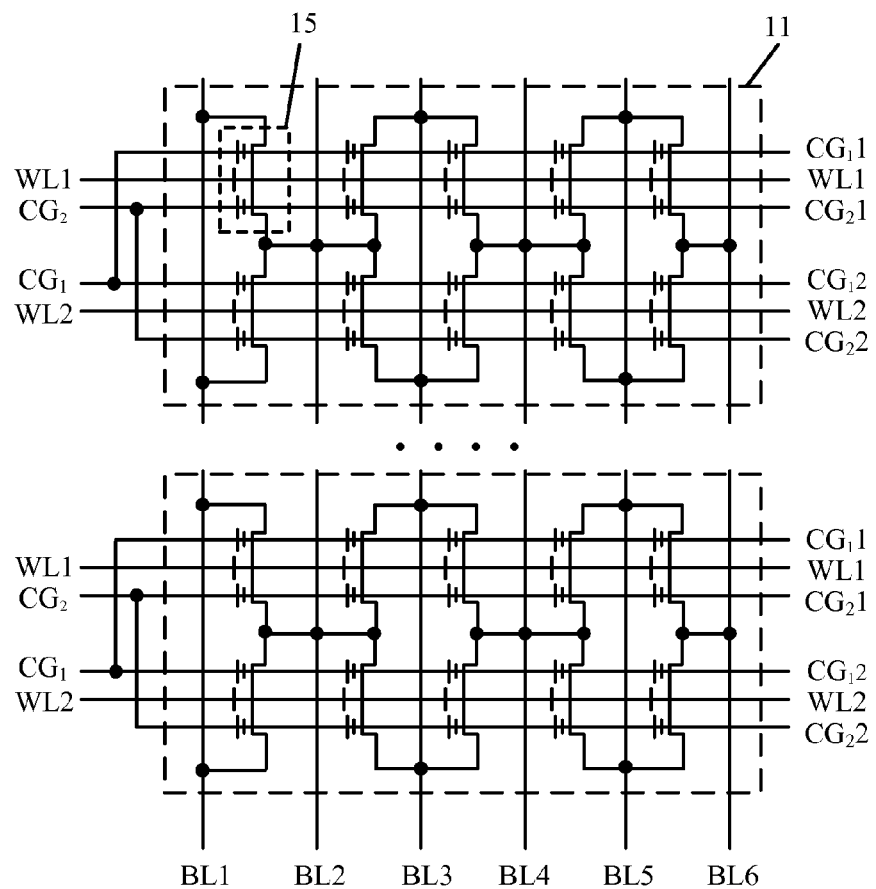
FIG. 2 schematically illustrates a structural diagram of a memory unit array in a memory circuit according to one embodiment of the present disclosure.

A memory circuit is provided according to an embodiment of the present disclosure. Referring to FIGS. 1 and 2, the memory circuit may include: a memory unit array 10, a plurality of sector decoding units 20 and a bit line decoding unit 30. The memory unit array 10 may include a plurality of sectors 11. In an erasing process, data are erased in sectors. Each sector decoding unit 20 corresponds to each sector 11 in the memory unit array 10. The sector decoding unit 20 may include a first control line decoding unit (not shown in figures), a second control line decoding unit (not shown in figures) and a word line decoding unit (not shown in figures). The word line decoding unit may control voltages on each word line in the corresponding sector, the first control line decoding unit may control voltages on first control lines in the corresponding sector, and the second control line decoding unit may control voltages on second control lines in the corresponding sector. A sum of the first control lines and the second control lines to be controlled is less than the number of the word line to be controlled, thereby decreasing the complexity of circuit structures of the first and second control line decoding units and reducing the chip area occupied by them. The bit line decoding unit 30 may be used to control voltages of bit lines in the memory unit array. The memory circuit may further include a control unit (not shown in figures) which is coupled to the sector decoding units 20 and the bit line decoding unit 30 to implement erasing, programming and reading operations to the memory unit array.

FIG. 2 schematically illustrates a structural diagram of the memory unit array 10 according to one embodiment. Referring to FIG. 2, the memory unit array 10 may include a plurality of sectors 11, where each sector may include two parallel rows of memory units 15. A first row of the memory units 15 may correspond to a first control line $CG_1\mathbf{1}$, a second control line $CG_2\mathbf{1}$ and a word line WL1 which are parallel with each other. The word line WL1 may be disposed between the first control line $CG_1\mathbf{1}$ and the second control line $CG_2\mathbf{1}$. A second row of the memory units 15 may correspond to a first control line $CG_1\mathbf{2}$, a second control line $CG_2\mathbf{2}$ and a word line WL2 which are parallel with each other. The word line WL2 may be disposed between the first control line $CG_1\mathbf{2}$ and the second control line $CG_2\mathbf{2}$. The memory unit array 10 may further include a plurality of bit lines (BL1, BL2, BL3, BL4, BL5 and BL6) perpendicular with the word lines. On two sides of each column of the memory units 15, there may be disposed two bit lines respectively coupled to the source and drain electrodes of the memory units 15. The two first control lines $CG_1\mathbf{1}$ and $CG_1\mathbf{2}$ may be connected to form a combined first control line $CG_1$ which is coupled to the first control line decoding unit in the corresponding sector decoding unit 20. The two second control lines $CG_2\mathbf{1}$ and $CG_2\mathbf{2}$ may be connected to form a combined second control line $CG_2$ which is coupled to the second control line decoding unit in the corresponding sector decoding unit 20.

In the same sector 11, two of the first control lines $CG_1\mathbf{1}$ and $CG_1\mathbf{2}$ are connected, two of the second control lines $CG_2\mathbf{1}$ and $CG_2\mathbf{2}$ are connected, while the word lines WL1 and WL2 are separated. Therefore, memory units to be programmed or to be read may be selected by controlling voltages on the bit lines and corresponding word lines.

Figure 3:
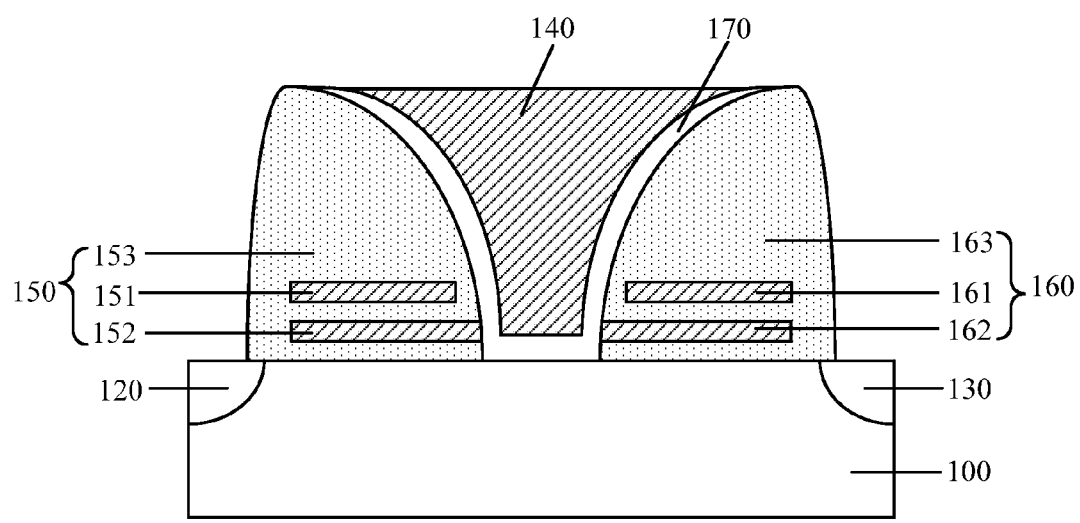
FIG. 3 schematically illustrates a structural diagram of a memory unit according to one embodiment of the present disclosure.

FIG. 3 schematically illustrates structures of a memory unit according to one embodiment. Referring to FIG. 3, the memory unit is a gate-split flash memory unit, including a semiconductor substrate 100, a first bit unit 150 and a second bit unit 160 which are disposed on a first surface of the semiconductor substrate 100 and spaced at a distance with each other, and a gate 140 filling up a groove between the first bit unit 150 and the second bit unit 160. The gate 140 is connected with a word line (not shown in FIG. 3). A tunneling oxidation layer 170 is formed, which separates the gate 140 from the semiconductor substrate 100, the first bit unit 150 and the second bit unit 160. The memory unit further includes a source 120 and a drain 130 disposed in regions of the semiconductor substrate 100 respectively close to the first bit unit 150 and the second bit unit 160. The source 120 is connected to a bit line on a first side of the memory unit through a conducting plug (not shown in FIG. 3), and the drain 130 is connected to a bit line on a second side of the memory unit through another conducting plug (not shown in FIG. 3). Specifically, the first bit unit 150 includes: a first float gate 152 above the semiconductor substrate 100, a first control gate 151 above the first float gate 152 and a first spacer 153 encompassing the first float gate 152 and the first control gate 151. The first float gate 152, the first control gate 151 and the semiconductor substrate are electrically insulated with each other. The first control gate 151 is connected to a first control line. The second bit unit 160 includes a second float gate 162, a second control gate 161 and a second spacer 163. The second control gate 161 is connected to a second control line. Detail structures of the second bit unit 160 are similar to the first bit unit 150.

In some embodiments, the gate-split flash memory unit may have other structures. For example, each of the float gates may be divided into two sub-layers of silicon nitride, which can achieve storing two bits in one bit unit. There are various gate-split flash memory devices can be selected, since existing gate-split flash memory may all have two separated bit units, which are practical in embodiments of the present disclosure. Those skilled in the art can select suitable gate-split flash memory devices according to practical requirements, which may not be illustrated in detail here.

In some embodiments, the first and second float gates may include polysilicon, silicon nitride, metal, or the like. In some embodiments, the first and second control gates may include polysilicon, or a conducting material like metal.

In some embodiments, the number of the memory unit rows in one sector may be 2. In some embodiments, there may be more than 2 rows of memory units in one sector, for example, 3 rows, 4 rows, 5 rows, 6 rows, 8 rows, 16 rows, 32 rows, or the like.

In some embodiments, all the first control lines in one sector may be connected, and all the second control lines in the sector may be connected.

Referring to FIGS. 1 and 2, since the first control lines $CG_1\mathbf{1}$ and $CG_1\mathbf{2}$ are connected, the first control line decoding unit may only need to generate one control voltage to be applied on the first control lines. Compared with conventional flash memory in which the first control line decoding unit may need to control voltages on two control lines, the first control line decoding unit of the memory circuit in embodiments of the present disclosure may have a simplified circuit structure. Further, if the number of the memory unit rows is larger than 2, the simplification may be enhanced. For example, if there are 8 rows of memory units in one sector, a conventional first control line decoding unit may need to control voltages on 8 control lines, while the first control line decoding unit of embodiments of the present disclosure may only need to control one voltage on one control line. Therefore, the chip area occupied by the first control line decoding unit may be reduced, and thus the sector decoding unit and further the whole memory circuit may occupy less chip area. As such, the memory density may be increased.

Connecting the second control lines may also contribute to increase the memory density, which can be simply conceived based on above description.

In some embodiments, when there are at least 4 rows of memory units in one sector, the sector may be divided into several parts, where each part may include at least two neighboring rows of memory units. In each part, all the first control lines may be connected, and all the second control lines may be connected. Therefore, at least half of the control lines to be controlled by the first and second control line decoding units in the memory circuit can be reduced, thereby simplifying the circuit structure of the first and second control line decoding units and reducing the chip area occupied by the sector decoding unit. Besides, since all the first control lines in one sector are connected and all the second control lines in the sector are connected, control voltages are only applied to the first and second control gates of corresponding memory units in the part when a memory unit in the part is selected to be programmed or read. The control voltages would not affect first and second control gates of memory units in other parts and other sectors. Furthermore, when another memory unit in another sector is selected to be operated, the control voltages applied to the first and second control gates of the former selected memory unit may be removed. Therefore, the period of applying relatively high control voltages to the first and second control gates of each memory unit in each memory cycle may be reduced, thereby avoiding damages on the insulating layer and the tunneling oxidation layer between the first and second control gates caused by continuous relatively high control voltages.

Hereunder operations of erasing, programming and reading the memory unit array shown in FIG. 2 will be illustrated as examples.

Referring to FIGS. 2 and 3, when the sector 11 in the memory unit array is to be erased, word line erasing voltages are applied to all the word lines WL1 and WL2 in the sector 11, a first control line erasing voltage is applied to all the first control lines $CG_1 1$ and $CG_1 2$ of the sector 11 to be erased, and a second control line erasing voltage is applied to all the second control lines $CG_2 1$ and $CG_2 2$. All other lines, including the word lines, first and second control lines corresponding to other sectors 11 which are not to be erased, and all the bit lines, are applied with voltages of 0V. In some embodiments, the word line erasing voltage may be 8V, the first control line erasing voltage may be −7V and the second control line erasing voltage may be −7V. In such way, the voltage differences between the gate 140 of the memory unit and the first polysilicon float gate 152, and between the gate 140 and the second polysilicon float gate 162, may cause electrons stored in the first and second float gates migrate into the gate through the tunneling oxidation layer. Therefore, information stored in the memory units of the sector 11 to be erased may be erased. In some embodiments, the word line erasing voltage, the first and second control line erasing voltages may be other suitable voltages.

Referring to FIGS. 2 and 3, when the memory unit 15 in the memory unit array is to be programmed, a word line programming larger than a threshold voltage is applied to the word line WL1 corresponding to the memory unit 15, voltages of 0V are applied to the other word line WL2 in the corresponding sector and word lines in all the other sectors, a first control line programming voltage is applied to all the first control lines $CG_1 1$ and $CG_1 2$, a second control line programming voltage is applied to all the second control lines $CG_2 1$ and $CG_2 2$, a first bit line programming voltage is applied to all the bit lines on one side of the memory unit to be programmed and a second bit line programming voltage is applied to all the bit lines on another side of the memory unit. Further, voltages of 0V are applied to first and second control lines of sectors which are not to be programmed. In some embodiments, the word line programming voltage may be 2V, the first control line programming voltage may be 8V, the second control line programming voltage may be 5V, the first bit lint programming voltage may be 4.5V and the second bit line programming voltage may be 0.4V, such that the current passing through the channel region may be 1 mAh and the first bit unit in the memory unit 15 may be programmed.

The word line programming voltage is only applied to the word line WL1 corresponding to one of the two memory unit rows in the sector 11 to open the channel in the semiconductor substrate 100 under the gate 140, and the first and second control line programming voltages are larger than the threshold voltage to open the channel between the source and drain, so that the memory units corresponding to the word line WL1 can be programmed. However, 0V is applied to the word line WL2, which means channel regions in semiconductor substrates under gates corresponding to the word line WL2 are not open and there are no currents passing through corresponding channel regions, thus memory units corresponding to the word line WL2 are not programmed. Different bit line voltages are only applied to two sides of the memory unit to be programmed to generate current in the channel region thereof. Besides, since the first control line programming voltage is high enough to tunnel the electrons in the channel region into the first float gate 152, and the second control line programming voltage is not high enough to tunnel the electrons in the channel region into the second float gate 161, only the first bit unit can be programmed. In some embodiments, the word line programming voltage, the first and second control line programming voltages, and the first and second bit line programming voltages can be other suitable voltages to implement programming the second bit unit.

In some embodiments, programming the memory unit can be achieved as follows. The first and second bit line programming voltages may be applied to two bit lines on two sides of the memory units to be programmed, while voltages applied to other bits on each side may decrease gradually until 0V. for example, if the memory unit between the bit lines BL4 and BL5 is to be programmed, the voltages applied to the bit lines BL1, BL2, BL3, BL4, BL5 and BL6 may be 0V, 1V, 2V, 4.5V, 0.4V and 0V, respectively. Therefore, the voltage difference between the bit lines BL4 and BL5 is large enough to generate a 1 mAh current in the channel region corresponding to the memory unit to be programmed, while the voltage differences between other pairs of bit lines may not be large enough to generate adequate hot carriers in the corresponding channel regions to be tunneled into the corresponding float gates. Therefore, only the memory unit to be programmed will be programmed. Furthermore, voltages are only applied to a relatively small number of bits lines while other bits lines are applied with 0V, power consumption of the memory device may be saved.

Referring to FIGS. 2 and 3, when the memory unit 15 in the memory unit array is to be read, a word line reading voltage higher than the threshold voltage is applied to the word line WL1 corresponding to the memory unit, 0V are applied to the other word line WL2 in the corresponding sector and all other word lines in other sectors, a first control line reading voltage is applied to all the first control lines $CG_1 1$ and $CG_1 2$, a second control line reading voltage is applied to all the second control lines $CG_2 1$ and $CG_2 2$, a first bit line reading voltage is applied to all bit lines on one side of the memory unit to be read, and a second bit line reading voltage is applied to all bit lines on another side of the memory unit to be read. The first and second control lines corresponding to the sectors which are not to be read are applied with 0V. in some embodiments, the word line reading voltage may be 2.5V, the first control line reading voltage may be 0V, the second control line reading voltage may be 3V, the first bit line reading voltage may be 0V, and the second bit line reading voltage may be 1V, such that the first bit unit of the memory unit can be read.

The channel region in the semiconductor substrate 100 under the corresponding gate 140 is open as a result of applying the word line reading voltage to the word line WL1 corresponding to one of the two memory unit rows in the sector 11. The first control line reading voltage is 0V and the second control line reading voltage is larger than the threshold voltage, which may open the channel region corresponding to the second bit unit of the memory unit. Therefore, whether there is a current passing through the channel regions may be depended on whether the channel region corresponding to the first bit unit is open, i.e., whether there are electrons in the first polysilicon float gate of the first bit unit. As such, whether the data stored in the first bit unit is 0 or 1 can be decided, thus implementing reading the first bit unit. Regarding the memory units corresponding to the word line WL2, since the WL2 is applied with 0V, the channel regions in the semiconductor substrates under the corresponding gates are not open. As a result, there is no current passing through the channel regions, so that the memory units corresponding to the word line WL2 may not be read. In some embodiments, the voltages applied to the word line, the first and second control lines, and the first and second bit lines may be changed to implement reading the second bit unit.

In some embodiments, the first bit line reading voltage can be applied to all bit lines on one side of the memory unit to be read, the second bit line reading voltage can be applied to two bit lines on another side of the memory unit and most close to the memory unit, and 0V are applied to all the other bit lines. For example, if the memory unit between the bit lines BL3 and BL4 is to be read, the voltages applied to the bit lines BL1, BL2, BL3, BL4, BL5 and BL6 may be 0V, 0V, 0V, 1V, 1V and 0V, respectively. The bit lines BL4 and BL5 are applied with the same voltage, which may prevent the bit line BL4 from being affected by the neighboring bit line BL5. Further, in the reading process, only the current on the bit line BL4 may be read. Therefore, whether there is current passing through the channel region of the memory unit between the bit lines BL5 and BL6 may not influence reading the memory unit to be read. Voltages are only applied to a relatively small number of bits lines while other bits lines are applied with 0V, power consumption of the memory device may be saved.

The invention is disclosed, but not limited, by preferred embodiments as above. Based on the disclosure of the invention, those skilled in the art can make any variation and modification without departing from the scope of the invention. Therefore, any simple modification, variation and polishing based on the embodiments described herein is within the scope of the present invention.

What is claimed is:

1. A memory circuit, comprising:
   a plurality of sectors, where each sector comprises at least two parallel rows of memory units, and each memory unit comprises a first bit unit and a second bit unit;
   a first control line, a second control line and a word line corresponding to each row of memory units, where the first control line controls the first bit units, the second control line controls the second bit units, and the word line is parallel with the first and second control lines, and where at least two neighboring first control lines which are in the same sector are connected, and at least two neighboring second control lines which are in the same sector are connected; and
   a plurality of bit lines perpendicular with the word lines,
   wherein the memory unit comprises a semiconductor substrate and a gate on the semiconductor substrate, the first bit unit and the second bit unit are on two sides of the gate, and the gate is coupled with the word line which is adapted for selecting the memory unit;
   wherein the memory unit further comprises a source in the semiconductor substrate which is on a side of the first bit unit far away from the gate, and a drain in the semiconductor substrate which is on a side of the second bit unit far away from the gate, where the source is coupled with a first bit line on one side of the memory unit, and the drain is coupled with a second bit line on another side of the memory unit; and
   wherein when a programming process is performed to one of the memory units, a word line programming voltage, a first control line programming voltage and a second control line programming voltage, which are higher than a threshold voltage of the memory unit, are respectively applied to the word line, the first control line and the second control line of the memory unit; and a first bit line programming voltage and a second bit line programming voltage having different values are respectively applied to the first bit line and the second bit line on two sides of the memory unit.

2. The memory circuit according to claim 1, further comprising a plurality of sector decoding units corresponding to the sectors respectively, each sector decoding unit comprising a first control line decoding unit, a second control line decoding unit and a word line decoding unit, wherein the word line decoding unit is used to control voltages on each word line in the sector, the first control line decoding unit is used to control voltages on the first control lines in the sector, and the second control line decoding unit is used to control voltages on the second control lines in the sector.

3. The memory circuit according to claim 2, wherein when all the first control lines in the same sector are connected and all the second control lines in the same sector are connected, the first control line decoding unit is used to control voltages on all the first control lines in the same sector, and the second control line decoding unit is used to control voltages on all the second control lines in the same sector.

4. The memory circuit according to claim 3, wherein when a programming process or a reading process is performed to one of the memory units in the sector, voltages on the first control lines in the sector corresponding to the memory unit are the same, voltages on the second control lines in the sector are the same, and a voltage on the word line corresponding to the memory unit to be programmed or read is different from voltages on other word lines in the sector.

5. The memory circuit according to claim 2, wherein a first part of the first control lines in the sector are connected, a second part of the first control lines in the sector are connected, a first part of the second control lines in the sector are connected, and a second part of the second control lines in the sector are connected, the first control line decoding unit corresponding to the sector is used to control voltages on the first and second parts of the first control lines, and the second control line decoding unit corresponding to the sector is used to control voltages on the first and second parts of the second control lines.

6. The memory circuit according to claim 5, wherein when a programming process or a reading process is performed to one of the memory units in the sector, voltages on the same part of the first control lines in the sector are the same, which are different from voltages on the other part of the first control lines in the sector and voltages on the first control lines in other sectors, voltages on the same part of the second control lines in the sector are the same, which are different from voltages on the other part of the second control lines in the sector and voltages on the second control lines in other sectors, and a voltage on the word line corresponding to the memory unit to be programmed or read is different from voltages on other word lines.

7. The memory circuit according to claim 1, wherein the memory unit further comprises: a tunneling oxidation layer between the semiconductor substrate and the first bit unit, and between the semiconductor substrate and the second bit unit, wherein the first bit unit comprises a first float gate, a first control gate and a first spacer encompassing the first float gate and the first control gate, and the second bit unit comprises a second float gate, a second control gate and a second spacer encompassing the second float gate and the second control gate.

8. The memory circuit according to claim 7, wherein the first control gate is coupled with the first control line, the second control gate is coupled with the second control line.

9. The memory circuit according to claim 1, wherein when a programming process or a reading process is performed to one of the memory units, the memory unit to be programmed or read is selected by controlling voltages on the bit lines and the word line corresponding to the memory unit.

10. The memory circuit according to claim 1, wherein when a programming process or a reading process is performed to one of the memory units, the memory unit to be programmed or read is selected by controlling voltages on the bit lines and the word line corresponding to the memory unit, and voltages on other bit lines on each side of the memory unit are gradually decreased to 0V.

11. The memory circuit according to claim 1, wherein there are at least two rows of memory units in one of the sectors.

\* \* \* \* \*